United States Patent
Ro

(10) Patent No.: US 11,145,941 B2
(45) Date of Patent: Oct. 12, 2021

(54) BATTERY MODULE

(71) Applicant: Samsung SDI Co., Ltd., Yongin-si (KR)

(72) Inventor: Hun Tae Ro, Yongin-si (KR)

(73) Assignee: Samsung SDI Co., Ltd., Gyeonggi-do (KR)

( * ) Notice: Subject to any disclaimer, the term of this patent is extended or adjusted under 35 U.S.C. 154(b) by 183 days.

(21) Appl. No.: 16/529,566

(22) Filed: Aug. 1, 2019

(65) Prior Publication Data

US 2019/0355959 A1 Nov. 21, 2019

Related U.S. Application Data

(63) Continuation of application No. PCT/KR2017/014502, filed on Dec. 12, 2017.

(30) Foreign Application Priority Data

Feb. 3, 2017 (KR) .......................... 10-2017-0015582

(51) Int. Cl.
*H01M 50/572* (2021.01)
*H01M 50/20* (2021.01)
*H01M 10/42* (2006.01)

(52) U.S. Cl.
CPC ....... *H01M 50/572* (2021.01); *H01M 10/425* (2013.01); *H01M 50/20* (2021.01); *H01M 2010/4271* (2013.01)

(58) Field of Classification Search
CPC ............. H01M 10/0481; H01M 10/42; H01M 10/425; H01M 2010/4271;
(Continued)

(56) References Cited

U.S. PATENT DOCUMENTS 7,927,728 B2  4/2011  Ha et al.
8,592,062 B2 * 11/2013  Kim ................... H01M 50/572
                                                    429/7

(Continued)

FOREIGN PATENT DOCUMENTS

CN      102934254      2/2013
EP      3 067 961      9/2016
(Continued)

OTHER PUBLICATIONS

Extended European Search Report dated Oct. 15, 2020 in patent application No. 17894771.9, 9 pp.
(Continued)

*Primary Examiner* — Carlos Barcena
(74) *Attorney, Agent, or Firm* — Knobbe, Martens, Olson & Bear, LLP

(57) ABSTRACT

A battery module is disclosed. In one aspect, the battery module includes a plurality of battery cells arranged in a first direction, and a circuit board placed on upper portions of the battery cells. The battery module also includes a bus bar electrically connecting the battery cells and electrically connected to the circuit board, and a pair of end plates respectively positioned at opposite ends of the battery cells in the first direction. The circuit board includes a connector located at one end of the circuit board and exposed to the exterior of the battery module. The connector is configured to be electrically connected to an external device. At least one of the pair of end plates is formed of a metallic material and includes a connector grounding portion enclosing the connector. The circuit board further includes a connection portion connected to the connector grounding portion.

12 Claims, 4 Drawing Sheets

(58) Field of Classification Search
CPC .. H01M 2220/20; H01M 50/20; H01M 50/50; H01M 50/502; H01M 50/572
See application file for complete search history.

(56) References Cited

U.S. PATENT DOCUMENTS

| | | |
|---|---|---|
| 9,136,513 B2 | 9/2015 | Kim |
| 9,553,286 B2 | 1/2017 | Moon et al. |
| 9,608,244 B2 | 3/2017 | Shin et al. |
| 9,761,916 B2 | 9/2017 | Nishihara et al. |
| 10,071,699 B2 | 9/2018 | Tanahashi et al. |
| 2010/0092861 A1 | 4/2010 | Kim |
| 2010/0247979 A1 | 9/2010 | Ha et al. |
| 2012/0003505 A1 | 1/2012 | Kim |
| 2012/0214024 A1 | 8/2012 | Moon et al. |
| 2013/0045403 A1 | 2/2013 | Shin et al. |
| 2013/0288105 A1 | 10/2013 | Niedzwiecki et al. |
| 2014/0329121 A1 | 11/2014 | Nishihara et al. |
| 2015/0131243 A1 | 5/2015 | Chen et al. |
| 2016/0200270 A1 | 7/2016 | Tanahashi et al. |
| 2016/0268556 A1* | 9/2016 | Naito .................. H01M 50/10 |
| 2019/0051875 A1 | 2/2019 | Choi et al. |

FOREIGN PATENT DOCUMENTS

| | | |
|---|---|---|
| JP | 2010-183830 A | 8/2010 |
| JP | 2010-287514 | 12/2010 |
| JP | 2019-512861 | 5/2019 |
| KR | 10-2008-0025430 A | 3/2008 |
| KR | 10-2009-0116976 A | 11/2009 |
| KR | 10-2014-0130357 | 11/2014 |
| KR | 10-2016-0087360 A | 7/2016 |
| KR | 10-1638113 B1 | 7/2016 |
| WO | WO 13/098982 | 7/2013 |
| WO | WO 13/099499 | 7/2013 |
| WO | WO 2016/204470 A1 | 12/2016 |

OTHER PUBLICATIONS

International Search Report dated Apr. 16, 2018 for International Patent Application No. PCT/KR2017/014502 of which subject U.S. Appl. No. 16/529,566 is a Continuation Application.
Office Action dated Jul. 27, 2020 in Japanese Patent Application No. 2019-538625, 2 pp.
Office action dated Jul. 14, 2021 in corresponding Chinese patent application No. 201780085039.X, 10 pp.

* cited by examiner

BATTERY MODULE

CROSS-REFERENCE TO RELATED APPLICATIONS

This application is a continuation application and claims the benefit under 35 U.S.C. §§ 120 and 365 of PCT Application No. KR2017/014502, filed on Dec. 12, 2017, which is hereby incorporated by reference. KR2017/014502 also claimed priority to Korean Patent Application No. 10-2017-0015582 filed on Feb. 3, 2017, which is hereby incorporated by reference.

BACKGROUND

Field

The described technology generally relates to a battery module.

Description of the Related Technology

In general, battery cells are used as energy sources for mobile devices, electric vehicles, hybrid vehicles, or electric bicycles, and various types of battery cells can be used based on the particular requirements of the external device(s) in which the battery cells are included.

Small mobile devices, such as mobile phones, can operate for a predetermined period of time using the output and capacity of a single battery. However, for high-power and/or longer time period operation(s), such as in an electric or hybrid vehicle that consumes a large amount of electricity, large-capacity battery module(s) are used. Such a large-capacity battery module can be constructed by electrically connecting multiple battery cells to increase the overall output and capacity of the large-capacity battery module. The output voltage and/or output current of a battery module can be increased in accordance with the number of battery cells included in the battery module. Multiple battery modules can be electrically connected together, forming a battery pack.

SUMMARY OF CERTAIN INVENTIVE ASPECTS

Battery module performance can decline due to electromagnetic compatibility (EMC) or electrostatic discharge (ESD) induced in a circuit board. Thus, there is a need to deal with ESD energy induced in low-voltage (LV) connector(s).

One inventive aspect is a battery module configured to deal with ESD induced in a low-voltage connector thereof.

Another aspect is a battery module including a circuit board stably placed on upper portions of multiple battery cells, a bus bar electrically connecting the multiple battery cells and electrically connected to the circuit board, and a pair of end plates respectively positioned at facing opposite end cells among the multiple battery cells which are arranged in one direction, wherein the circuit board includes a connector located at one end thereof and exposed to an exterior side of the battery module to be electrically connected with an external device, and at least one of the pair of end plates is made of a metallic material and includes a connector grounding portion located around the connector, and a connection portion connected to the connector grounding portion.

In an example, the connector grounding portion and the connection portion are made of the same material as the end plates made of a metallic material and are grounded to the end plates.

In an example, the battery module may further include a pair of side plates coupled to the pair of end plates so as to cover short side surfaces of the multiple battery cells, and an upper cover coupled to the end plates and the side plates to protect the bus bar and the circuit board, wherein the connector is exposed to an exterior side of the upper cover.

In an example, the connector grounding portion may be located at an entrance portion of an outer end of the connector so as to have a predetermined thickness, conforming to the edge of the entrance portion.

In an example, the pair of end plates and the pair of side plates may be made of a metallic material and may be grounded.

In an example, the upper cover may be made of an insulating material.

Another aspect is a battery module including a circuit board stably placed on upper portions of multiple battery cells, a bus bar electrically connecting the multiple battery cells and electrically connected to the circuit board, a pair of end plates respectively positioned at facing opposite end cells among the multiple battery cells which are arranged in one direction, a pair of side plates coupled to the pair of end plates so as to cover short side surfaces of the multiple battery cells, an upper cover coupled to the end plates and the side plates to protect the bus bar and the circuit board, and a connector located at one end of the circuit board and exposed to an exterior side of the battery module to be electrically connected with an external device, wherein the connector includes a metallic connector housing located outside an entrance portion of the connector, and the connector housing includes a grounding pin connector electrically connected to a grounding pin among connecting pins of the connector.

Here, the grounding pin of the connector connected to a grounding pin connection portion of the connector housing may be connected to the metallic material of the battery module through a pattern of the circuit board.

Yet another aspect includes end plates of a battery module positioned at opposite end cells of multiple battery cells arranged in one direction, the end plates including a main plate made of a metallic material and having an area corresponding to the size of one side surface of the battery module, a connector grounding portion made of a metallic material and located around a connector of the battery module, and a connection portion made of a metallic material and connecting the connector grounding portion and the main plate.

Still yet another aspect includes a battery module, comprising: a plurality of battery cells arranged in a first direction; a circuit board placed on upper portions of the battery cells; a bus bar electrically connecting the battery cells and electrically connected to the circuit board; and a pair of end plates respectively positioned at opposite ends of the battery cells in the first direction, wherein the circuit board comprises: a connector located at one end of the circuit board and exposed to the exterior of the battery module, wherein the connector is configured to be electrically connected to an external device, and wherein at least one of the pair of end plates is formed of a metallic material and comprises a connector grounding portion enclosing the connector, and a connection portion connected to the connector grounding portion.

In an example, the connector grounding portion and the connection portion is formed of the same material as the end plates and are grounded to the end plates.

In an example, the battery module may further include a pair of side plates coupled to the pair of end plates so as to cover short side surfaces of the battery cells; and an upper cover coupled to the end plates and the side plates to protect the bus bar and the circuit board, wherein the connector is exposed to the exterior of the upper cover.

In an example, the connector grounding portion is located at a receptacle of an outer end of the connector and has a predetermined thickness conforming to the edge of the receptacle.

In an example, the pair of end plates and the pair of side plates are formed of a metallic material and are grounded.

In an example, the upper cover is formed of an insulating material.

Another aspect includes a battery module, comprising: a plurality of battery cells arranged in a first direction; a circuit board placed on upper portions of the battery cells; a bus bar electrically connecting the battery cells and electrically connected to the circuit board; a pair of end plates respectively positioned at opposite ends of the battery cells in the first direction; a pair of side plates coupled to the pair of end plates so as to cover short side surfaces of the battery cells; an upper cover coupled to the end plates and the side plates to protect the bus bar and the circuit board; and a connector located at one end of the circuit board and exposed to the exterior of the battery module, wherein the connector is configured to be electrically connected to an external device, wherein the connector comprises a metallic connector housing located outside a receptacle of the connector, and the connector housing comprises a grounding pin connector electrically connected to one of a plurality of connecting pins of the connector.

In an example, the grounding pin of the connector is connected to the metallic material of the battery module through a conductive pattern on the surface of the circuit board.

In an example, the battery module may further include an inner housing formed of an insulating material.

In an example, the connector housing encloses the inner housing.

In an example, the connector housing encloses only a top surface of the inner housing.

In an example, the connector housing directly encloses the plurality of connecting pins.

Yet another aspect includes end plates of a battery module positioned at opposite ends of a plurality of battery cells arranged in a first direction, the end plates comprising: a main plate formed of a first metallic material and having an area corresponding to the size of one side surface of the battery module; a connector grounding portion formed of a second metallic material and enclosing a connector of the battery module; and a connection portion formed of a third metallic material and connecting the connector grounding portion and the main plate.

In an example, the first, second and third metallic materials comprise the same material.

According to at least one of the disclosed embodiments, the battery module can effuse or dissipate ESD induced in a low-voltage connector by grounding the ESD using an external metal case through a metallic edge located outside the connector.

In addition, the battery module according to at least one embodiment can ground ESD induced in a low-voltage connector by connecting an external metal case located outside the connector to a ground line among various internal lines of the connector.

DETAILED DESCRIPTION OF CERTAIN INVENTIVE ASPECTS

Figure 1:
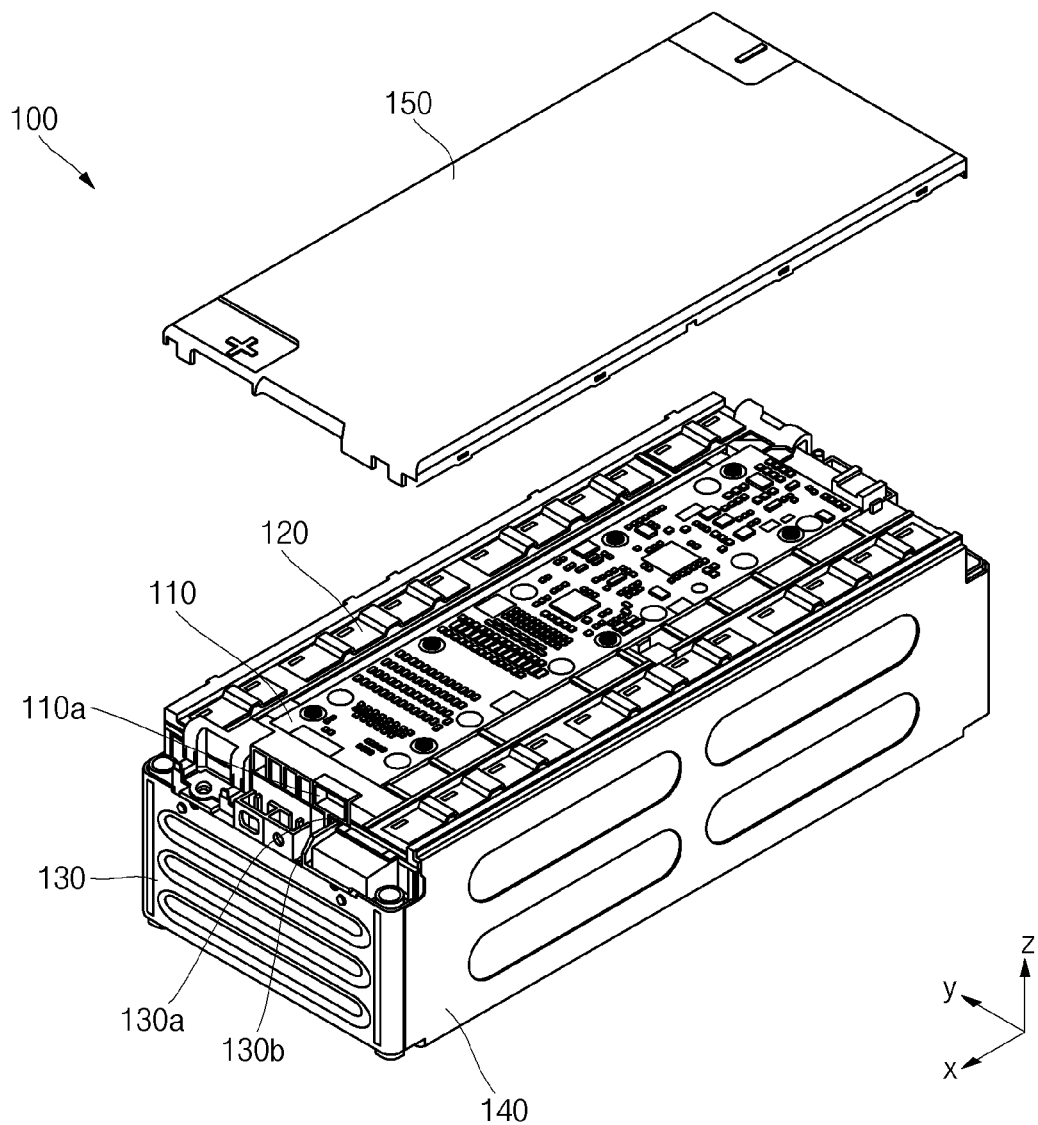
FIG. 1 is an exploded perspective view of an upper cover of a battery module according to an embodiment of the described technology.

Hereinafter, embodiments of the described technology will be described in detail.

Various embodiments of the described technology may be embodied in many different forms and should not be construed as being limited to the example embodiments set forth herein. Rather, these example embodiments of the disclosure are provided so that this disclosure will be thorough and complete and will convey inventive concepts of the disclosure to those skilled in the art.

In the accompanying drawings, sizes or thicknesses of various components may be exaggerated for brevity and/or clarity Like numbers refer to like elements throughout. As used herein, the term "and/or" includes any and all combinations of one or more of the associated listed items. In addition, it will be understood that when an element A is referred to as being "connected to" an element B, the element A can be directly connected to the element B or an intervening element C may be present and the element A and the element B are indirectly connected to each other.

The terminology used herein is for the purpose of describing particular embodiments only and is not intended to be limiting of the disclosure. As used herein, the singular forms are intended to include the plural forms as well, unless the context clearly indicates otherwise. It will be further understood that the terms "comprise" or "include" and/or "comprising" or "including," when used in this specification, specify the presence of stated features, numbers, steps, operations, elements, and/or components, but do not preclude the presence or addition of one or more other features, numbers, steps, operations, elements, components, and/or groups thereof.

It will be understood that, although the terms first, second, etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "on" or "above" the other elements or features. Thus, the exemplary term "below" can encompass both an orientation of above and below.

Figure 2:
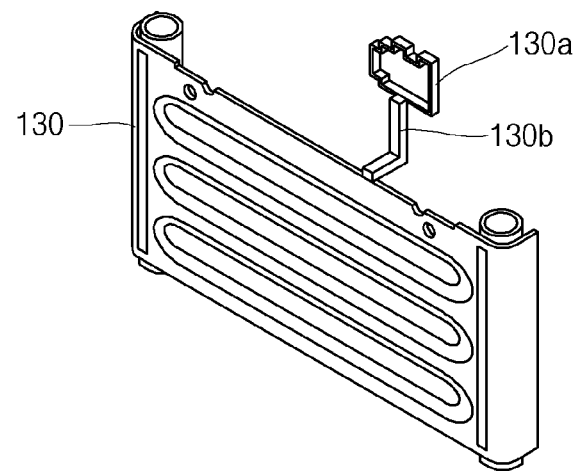
FIG. 2 is a perspective view of an end plate of the battery module according to an embodiment of the described technology.

FIG. 1 is an exploded perspective view of an upper cover of a battery module according to an embodiment of the described technology. FIG. 2 is a perspective view of an end plate of the battery module according to an embodiment of the described technology.

Referring to FIGS. 1 and 2, the battery module 100 according to an embodiment of the described technology includes multiple battery cells, an inner cover, a circuit board 110, bus bars 120, end plates 130, side plates 140, and an upper cover 150.

A battery cell (not shown) is an energy generating device and can include multiple battery cells arranged in a first direction x, although not shown. The battery cell can include a case having an opening located at its top surface and an electrode assembly accommodated in the case with an electrolyte. The opening of the case can be sealed by a cap assembly. In addition, electrode terminals having different polarities, that is, a positive electrode terminal and a negative electrode terminal, can be provided in the cap assembly defining a top surface of the battery cell.

An inner cover (not shown) can be positioned on upper portions of the multiple battery cells, and multiple bus bars 120 for electrically connecting the multiple battery cells can be placed on the inner cover. The inner cover can be sized to cover the entirety of the upper portions of the multiple battery cells. In addition, the inner cover can include a plurality of holes that expose electrode terminals of the multiple battery cells to the upper portions of the multiple battery cells. The inner cover can be made of an insulating material, which may be advantageous in certain embodiments.

The circuit board 110 is coupled to an upper portion of the inner cover and includes electronic devices for controlling and monitoring charge/discharge states of the multiple battery cells. The circuit board 110 can be coupled to the center of the bus bars 120 on the inner cover so as to be spaced apart from the bus bars 120 arranged on opposite sides of the circuit board 110. That is to say, the circuit board 110 can be placed at the center of the upper portion of the inner cover in the first direction x, and multiple bus bars 120 for electrically connecting the multiple cells can be placed at opposite sides of the circuit board 110 in the first direction x. In addition, the circuit board 110 can be electrically connected to the bus bars 120. The bus bars 120 can be electrically connected to input/output terminals located on a bottom surface of the circuit board 110. That is to say, a circuit board connection portion of the bus bars 120 can be connected to the input/output terminals provided on the bottom surface of the circuit board 110. In addition, the circuit board 110 includes a connector 110a exposed to the exterior side of the battery module 100 to be electrically connected to an external device. The connector 110a can be a low-voltage (LV) connector.

The bus bars 120 connect the battery cells to one another in series or in parallel by connecting electrode terminals of neighboring battery cells. The bus bars 120 are brought into contact with and connected to electrode terminals upwardly exposed through the inner cover. The bus bars 120 can also be supported by the inner cover. The bus bars 120 can electrically connect the electrode terminals arranged on the same columns among the multiple battery cells arranged in the first direction x. That is to say, the bus bars 120 can be arranged at opposite sides on the inner cover in the first direction x so as to be spaced apart from each other. The bus bars 120 can include a circuit board connection portion protruding toward the circuit board 110. The circuit board connection portion may be coupled to the circuit board 110 to then be electrically connected thereto.

The end plates 130 are respectively positioned adjacent to end cells of the multiple battery cells formed on opposing sides of the battery cells and arranged in one direction. At least one of the end plates 130 positioned adjacent to the end cells can be formed of a metallic material, and the end plate 130 formed of a metallic material further includes a connector grounding portion 130a and a connection portion 130b. The connector grounding portion 130a is configured to enclose the connector 110a at an entrance portion (also referred to herein as a receptacle or a socket) of the connector 110a of the circuit board 110. That is to say, the connector grounding portion 130a can be located at the entrance portion of the outer end of the connector 110a so as to have a predetermined thickness, conforming to the edge of the entrance portion, as shown in FIG. 2, and may be shaped of a rectangular ring as a whole. Meanwhile, the connector grounding portion 130a can extend to enclose the whole connector 110a or can extend to enclose only top and side surfaces of the connector 110a. The connection portion 130b can be formed as a metallic connection line extending from the main plate of the end plates 130 to the connector grounding portion 130a. The connection portion 130b can be provided so as to be adapted to the curved outer surface shape of the battery module 100 according to the external shape of the battery module 100. The connector grounding portion 130a and the connection portion 130b can be formed of the same material as the end plates 130. In addition, the end plate 130 having the connector grounding portion 130a and the connection portion 130b can further include an external ground line to be grounded. When the end plate 130 is capable of absorbing ESD energy, the external ground line may not be needed.

As described above, since the connector grounding portion 130a enclosing the connector 110a of the circuit board 110 is made of a metallic material, the ESD induced in the connector 110a, specifically, to a low-voltage connector, can be allowed to flow out to the end plates 130, which define a metal case, along the connector grounding portion 130a exposed to the exterior of the battery module 100 through the connection portion 130b, and to finally flow out to ground. Accordingly, the ESD or EMC problem(s) arising in battery modules 100 used in electric vehicles can be solved.

Meanwhile, one end plate 130 of the pair of end plates 130, including the connector grounding portion 130a and the connection portion 130b, and the other end plate 130b opposite to the one end plate 130a, can be formed of the same metal, thereby protecting the battery module 100 using the metal case.

In addition, the side plates 140 may be coupled to the pair of end plates 130 so as to cover the short side surfaces of the multiple battery cells. That is to say, the multiple battery cells can be arranged in the first direction x in a space defined by the pair of end plates 130 and the pair of side plates 140.

The upper cover 150 can be combined with the end plates 130 and the side plates 140 to protect the bus bars 120 and the circuit board 110 from external circumferences. The upper cover 150 can be formed of an insulating material.

Figure 3:
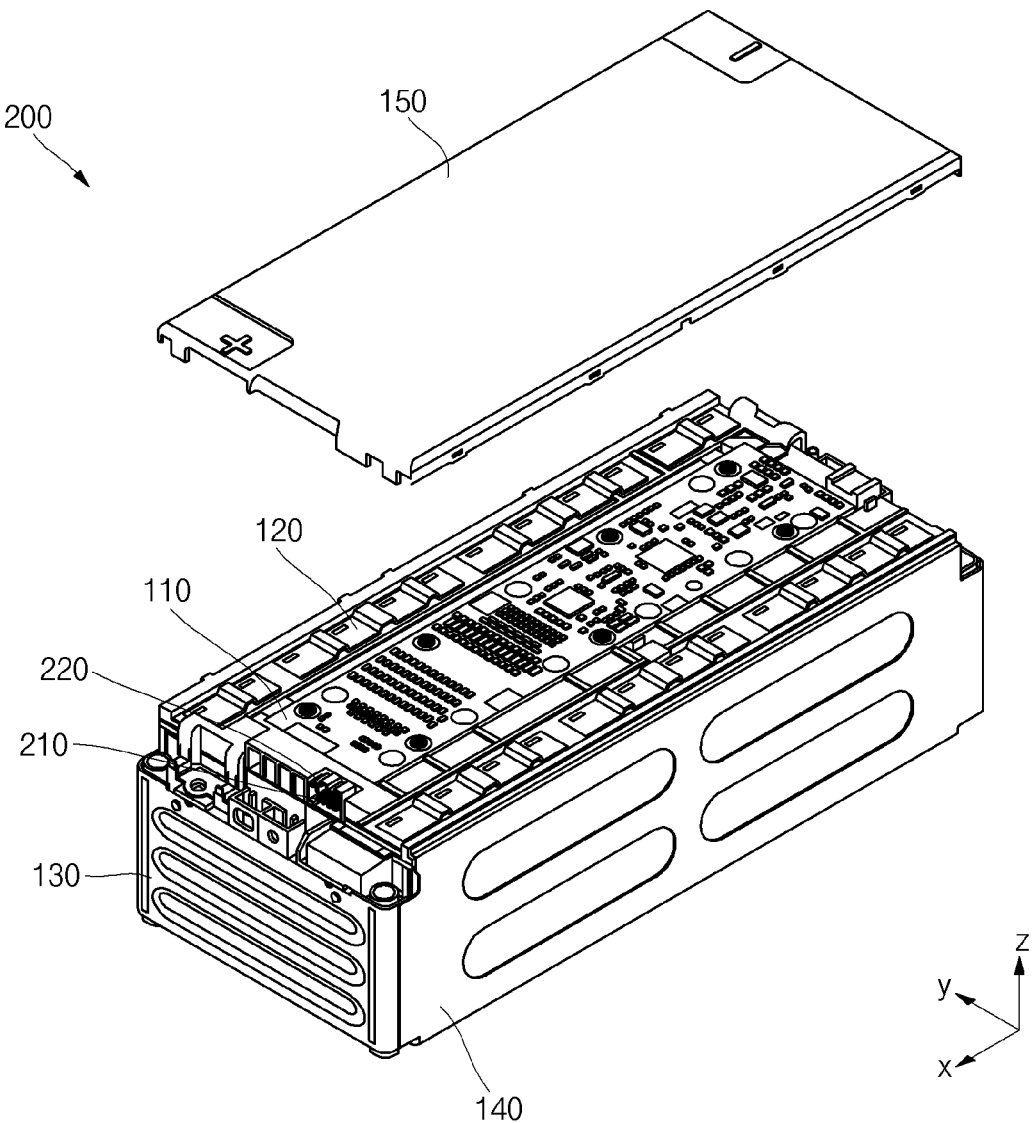
FIG. 3 is a perspective view of a battery module according to another embodiment of the described technology.
Figure 4:
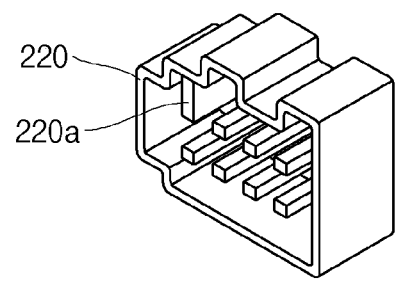
FIG. 4 is a perspective view of a connector of the battery module according to another embodiment of the described technology.
Figure 5:
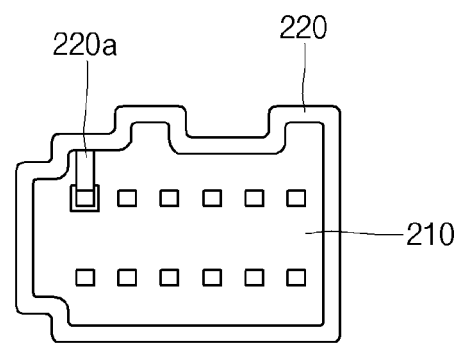
FIG. 5 is a front view of the connector shown in FIG. 4.

FIG. 3 is a perspective view of a battery module according to another embodiment of the described technology. FIG. 4 is a perspective view of a connector of the battery module according to another embodiment of the described technology. FIG. 5 is a front view of the connector shown in FIG. 4.

Referring to FIGS. 3 to 5, the battery module 200 according to another embodiment of the described technology includes multiple battery cells, an inner cover, a circuit board 110, bus bars 120, end plates 130, side plates 140, and an upper cover 150, like the battery module 100 shown in FIG. 1.

The multiple battery cells, the inner cover, the circuit board 110, the bus bars 120, the side plates 140, and the upper cover 150 of the battery module 200 may be substantially the same components of the corresponding functional components of the battery module 100, except for the end plates 130 of the battery module 100. That is to say, unlike the end plates 130 of the battery module 100, the end plates 130 of the battery module 200 may not be provided with a connector grounding portion and a connection portion.

Meanwhile, the circuit board 110 of the battery module 200 includes a connector 210, which is different from the connector 110a of the battery module 100 shown in FIG. 1. Referring to FIGS. 4 and 5, the connector 210 includes a metallic connector housing 220 located outside the connector 210. The connector housing 220 can be fabricated to enclose an inner housing formed of an insulating material (not shown). In other embodiments, the connector housing 220 can be fabricated to enclose multiple connector pins without an inner housing (e.g., by directly enclosing the multiple connector pins). In certain embodiments, the connector housing 220 can also be fabricated to enclose only a top surface of an insulating housing or only top and side surfaces of the insulating housing. In yet other embodiments, the connector housing 220 can be located only on an upper portion of an entrance portion of the connector 210.

The connector housing 220 includes a grounding pin connection portion 220a electrically connected to a grounding pin led to a grounding line among multiple connecting pins of the connector 210. The grounding pin connection portion 220a can protrude and extend from an inner surface of the connector housing 220 to then be integrally formed with the grounding pin. Alternatively, the grounding pin connection portion 220a can be fabricated to enclose the grounding pin such that it extends from the inner surface of the connector housing 220 so as to be electrically connected to the grounding pin. FIG. 4 shows that the grounding pin connection portion 220a is integrally formed with the grounding pin of the connector 210. FIG. 5 shows the grounding pin connection portion 220a encloses the edge of the grounding pin of the connector 210 to be electrically connected to the grounding pin of the connector 210.

In addition, the grounding pin of the connector 210 connected to the grounding pin connection portion 220a of the connector housing 220 is connected to a metallic material of the battery module 200 through a pattern of the circuit board 110. The metallic material can correspond to the end plates 130 or the side plates 140. Alternatively, the metallic material can correspond to an external grounding line.

As described above, in the battery module 200 according to another embodiment of the described technology, the ESD generated in vicinity of the connector 210 flows out to the grounding pin connection portion 220a and the grounding pin through the connector housing 220. The ESD having flowed out to the grounding pin will be grounded to the metallic material of the battery module 200 through the pattern of the circuit board or an external grounding line. Therefore, the ESD or EMC problem(s) arising in battery modules 200 used in electric vehicles can be solved.

Although the foregoing embodiments have been described to practice the battery module of the described technology, these embodiments are set forth for illustrative purposes and do not serve to limit the invention. Those skilled in the art will readily appreciate that many modifications and variations can be made, without departing from the spirit and scope of the invention as defined in the appended claims, and such modifications and variations are encompassed within the scope and spirit of the present invention.

What is claimed is:

1. A battery module, comprising:
a plurality of battery cells arranged in a first direction;
a circuit board arranged on upper portions of the battery cells;
a bus bar electrically connecting the battery cells and electrically connected to the circuit board; and
a pair of end plates respectively positioned at opposite ends of the battery cells in the first direction,
wherein the circuit board comprises:
a connector located at one end of the circuit board and exposed to the exterior of the battery module, wherein the connector is configured to be electrically connected to an external device, and wherein at least one of the pair of end plates is formed of a metallic material and comprises a connector grounding portion enclosing the connector, and
a connection portion connected to the connector grounding portion.

2. The battery module of claim 1, wherein the connector grounding portion and the connection portion are formed of the same material as the end plates and are grounded to the end plates.

3. The battery module of claim 1, further comprising:
a pair of side plates coupled to the pair of end plates so as to cover short side surfaces of the battery cells; and
an upper cover coupled to the end plates and the side plates to protect the bus bar and the circuit board,
wherein the connector is exposed to the exterior of the upper cover.

4. The battery module of claim 3, wherein the pair of end plates and the pair of side plates are formed of a metallic material and are grounded.

5. The battery module of claim 3, wherein the upper cover is formed of an insulating material.

6. The battery module of claim 1, wherein the connector grounding portion is located at a receptacle of an outer end of the connector and has a predetermined thickness conforming to the edge of the receptacle.

7. A battery module, comprising:
a plurality of battery cells arranged in a first direction;
a circuit board placed on upper portions of the battery cells;
a bus bar electrically connecting the battery cells and electrically connected to the circuit board;
a pair of end plates respectively positioned at opposite ends of the battery cells in the first direction;
a pair of side plates coupled to the pair of end plates so as to cover short side surfaces of the battery cells;
an upper cover coupled to the end plates and the side plates to protect the bus bar and the circuit board; and a connector located at one end of the circuit board and exposed to the exterior of the battery module, wherein the connector is configured to be electrically connected to an external device, and wherein at least one of the pair of end plates is formed of a metallic material and comprises a connector grounding portion enclosing the connector, and a connection portion connected to the connector grounding portion; and wherein the connector comprises a metallic connector housing located outside a receptacle of the connector, and the connector housing comprises a grounding pin connector electrically connected to one of a plurality of connecting pins of the connector.

8. The battery module of claim 7, wherein the grounding pin of the connector is connected to the metallic material of the battery module through a conductive pattern on the surface of the circuit board.

9. The battery module of claim 7, further comprising:
an inner housing formed of an insulating material.

10. The battery module of claim 9, wherein the connector housing encloses the inner housing.

11. The battery module of claim 9, wherein the connector housing encloses only a top surface of the inner housing.

12. The battery module of claim 7, wherein the connector housing directly encloses the plurality of connecting pins.

* * * * *